(12) United States Patent
Hoffmann et al.

(10) Patent No.: US 7,964,802 B2
(45) Date of Patent: Jun. 21, 2011

(54) INTERPOSER FOR DECOUPLING INTEGRATED CIRCUITS ON A CIRCUIT BOARD

(75) Inventors: Hans Hoffmann, Lauffen (DE); Werner Wölfel, Stuttgart (DE)

(73) Assignee: Alcatel-Lucent, Paris (FR)

( * ) Notice: Subject to any disclaimer, the term of this patent is extended or adjusted under 35 U.S.C. 154(b) by 1078 days.

(21) Appl. No.: 11/302,268

(22) Filed: Dec. 14, 2005

(65) Prior Publication Data

US 2006/0176674 A1 Aug. 10, 2006

(30) Foreign Application Priority Data

Feb. 4, 2005 (EP) ..................... 05290242

(51) Int. Cl.
*H05K 1/11* (2006.01)
(52) U.S. Cl. ........................ 174/264; 361/768
(58) Field of Classification Search .......... 174/260, 174/262, 264; 361/768, 306.3
See application file for complete search history.

(56) References Cited

U.S. PATENT DOCUMENTS

| | | | |
|---|---|---|---|
| 6,292,351 B1 * | 9/2001 | Ahiko et al. | 361/306.3 |
| 6,512,182 B2 * | 1/2003 | Takeuchi et al. | 174/256 |
| 6,791,035 B2 * | 9/2004 | Pearson et al. | 174/255 |
| 7,068,490 B2 * | 6/2006 | Prymak | 361/306.3 |
| 7,463,474 B2 * | 12/2008 | Ritter et al. | 361/306.1 |
| 7,545,623 B2 * | 6/2009 | Randall et al. | 361/306.2 |
| 2004/0108587 A1 * | 6/2004 | Chudzik et al. | 257/700 |
| 2004/0121266 A1 | 6/2004 | Lee et al. | |

FOREIGN PATENT DOCUMENTS

| | | |
|---|---|---|
| EP | 1 100 096 A1 | 5/2001 |
| FR | 2 622 346 A1 | 4/1989 |

OTHER PUBLICATIONS

Joel Peiffer, et al. "Electrical Performance Advantages of Ultra-Thin Dielectric Materials Used for Power-Ground Cores in High Speed, Multilayer Printed Circuit Boards" Manuscript of paper for IPC Expo 2003, Mar. 25-27, 2003, Long Beach, CA, p. 1.
Interconnect Systems Inc., Semiconductor Enhancement Modules, Mar. 2004, pp. 1-8.
Richard Snogren; Emerging Technologies, Embedded Passives: The Next Revolution, Nov. 2002, p. 26-29 and 67.

* cited by examiner

*Primary Examiner* — Yuriy Semenenko
(74) *Attorney, Agent, or Firm* — Harness, Dickey & Pierce, P.L.C.

(57) ABSTRACT

An interposer (20) is used for decoupling a microchip (10) on a circuit board (30). The interposer (20) contains on its upper and lower surfaces structured metal layers (26a-26d) for attachment to the microchip (10) and the circuit board (30), respectively. Inside the interposer, there are two sets of mutually isolated metal structures (21, 22) extending substantially perpendicular to the upper and lower surfaces of said interposer (20). The first set (21) extends closer towards the upper surface than the second set (22), while said second set (22) extends closer towards the lower surface than said first set (21).

10 Claims, 3 Drawing Sheets

INTERPOSER FOR DECOUPLING INTEGRATED CIRCUITS ON A CIRCUIT BOARD

The invention is based on a priority application EP 05290242.6 which is hereby incorporated by reference.

FIELD OF THE INVENTION

The present invention relates to the field of electronics and more particular to an interposer for use on a printed circuit board for decoupling integrated circuits.

BACKGROUND OF THE INVENTION

As the level of integration increases, the number of pins of a integrated circuit package that need to be connected to a circuit board becomes larger and larger. A well known packaging technique is called Ball Grid Array (BGA), which is a type of microchip connection methodology. A Ball Grid Array chip is a square package with solder balls on the underside for surface mounting. Use of BGA allows die package size to be reduced by allowing more surface area for attachment. Smaller packaging allows more components to be mounted on a module making greater densities available.

On the other hand, the clock rate under which modern integrated circuits operate becomes higher and higher with every generation of microchips. A basic requirement for high speed operation is the availability of sufficient energy at each power pin of the integrated circuit. This decoupling is typically achieved by connecting capacitors to each power pin, which buffer the current source and supply the short term energy demand. These capacitors, however, consume surface area on the circuit board and hence limit the achievable integration density.

It has also been proposed to place an interposer between a microchip and the printed circuit board. An interposer is realized as a small, thin printed circuit board, which contains buried components such as capacitors and resistors arranged in layers inside the interposer. A buried capacitors is realized using a thin metalized dielectric foil. Such laminates can achieve a capacity of 4-10 nF/in$^2$. However, since the surface area and volume of the interposer is limited, the number and capacity of capacitors that can be buried for the decoupling of power pins is restricted.

It is therefore an object of the present invention to provide an improved decoupling for microchips on circuit boards.

SUMMARY OF THE INVENTION

These and other objects of the invention that appear below are achieved by an interposer for the decoupling of a microchip on a circuit board. The interposer contains on its upper and lower surfaces structured metal layers for attachment to the microchip and the circuit board, respectively. Inside the interposer, there are two sets of mutually isolated metal structures extending substantially perpendicular to the upper and lower surfaces of said interposer. The first set extends closer towards the upper surface than said second set, while the second set extends closer towards the lower surface than said first set.

According to the invention, the two sets of metal structures are arranged in a regular, non-structured pattern within said interposer at a spacing between adjacent metal structures which is smaller than the pitch of two connections of the microchip. Moreover, the metal layers are structured in an application specific way to form capacitors by connecting metal structures from the first set to the top metal layer and adjacent metal structures from the second set to the bottom metal layer.

In this interposer, capacitors are easily formed by connecting metal structures from the first set to the top metal layer and adjacent metal structures from the second set to the bottom metal layer. This allows high capacities with very short connections for every pin. The new interposer is a standard base element that can be applied with high flexibility.

BRIEF DESCRIPTION OF THE DRAWINGS

Preferred embodiments of the invention will be described below with reference to the accompanying drawings, in which.

DETAILED DESCRIPTION OF THE INVENTION

Figure 1:
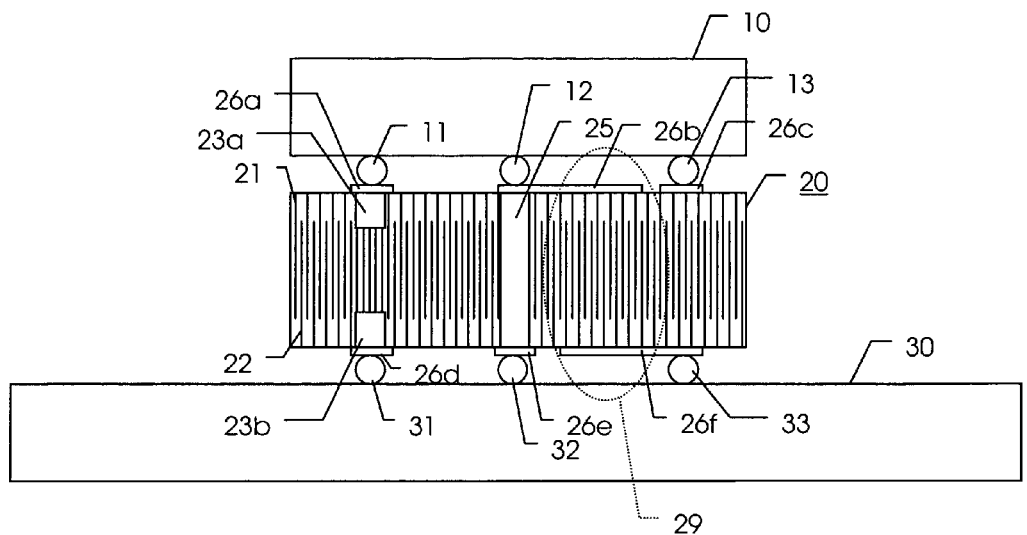
FIG. 1 shows a first embodiment of a BGA microchip attached with an interposer on a circuit board.

A first embodiment of the invention is shown schematically as a cross-section in FIG. 1. A Ball Grid Array (BGA) packaged microchip 10 is attached on an interposer 20, which is fastened on a printed circuit board 30. The microchip has three solder balls 11, 12, and 13 on its bottom side, which connect to corresponding solder pads 26a, 26b, and 26c on the top surface of the interposer. Solder balls 31, 32, and 33 on the circuit board 30 connect to corresponding solder pads 26d, 26e, and 26f on the bottom surface of the interposer 20.

The interposer 20 itself contains vertical metal structures 21, 22 of alternating type. A first set of metal structures 21 extends towards the top surface layer of the interposer 20 and a second set of metal structures 22 extends towards the bottom surface of the interposer 20. Solder pads 26b and 26c hence connect to some of the upper metal structures 21, while solder pad 26f for instance connects to some of the lower metal structures 22. Solder pads 26a and 26d are deposited on top of respective blind vias 23a and 23b (i.e., metal coated blind holes), which reach down to some of the opposite side metal structures. Hence, between solder balls 11 and 31, there exists a shortcut over the respective metal structures 21 and 22, which represents a through connection. Moreover, under solder pads 26b and 26e, there is a via 25 interconnecting these pads directly. The area 29 serves as a capacitor between solder pads 26b and 26d.

Blind vias 23a and 23b and via 25 are drilled mechanically or with lasers. Metal coatings are deposited galvanically or chemically and structured by a wet etching process as known in the art.

In this simplified example, solder ball 12 is a power pin of microchip 10 and is connected over through-connection 25 to a power supply point 32 on the circuit board. Solder ball 33 on the circuit board connects to ground level, so that the capacitor 29 built by the metal structures between pads 26b and 26d serves to decouple power pin 12.

Figure 2:
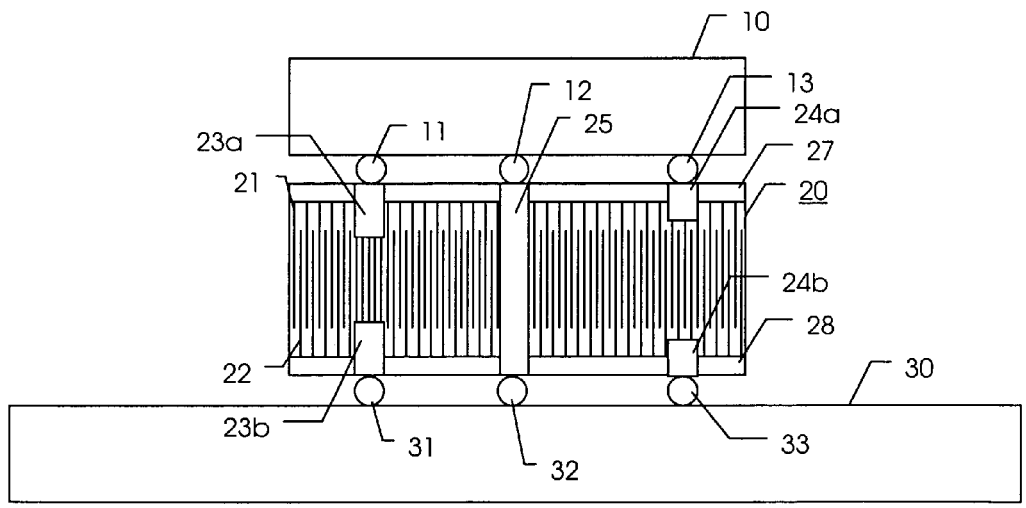
FIG. 2 shows a second embodiment of a BGA microchip attached with an interposer on a circuit board.

FIG. 2 shows a similar assembly but with the difference that instead of single top and bottom metal layers, additional circuit board layers 27 and 28 are provided, which may contain additional connections and elements. The additional circuit board layers 27 and 28 include top and bottom metal layers structured for the attachment of microchip and circuit board, but which are not shown separately.

Due to the extra circuit board layers 27 and 28, blind vias of different depth are required to connect to the inner metal structures 21 and 22. Under solder balls 13 and 33, there are blind vias 24a and 24b of a first depth extending towards only the closer metal structures. Conversely, under solder balls 11 and 31, there are deeper blind vias 23a and 23b, respectively, connecting towards the deeper metal structures, too, so that these form a similar through-connection as in FIG. 1.

Figure 3:
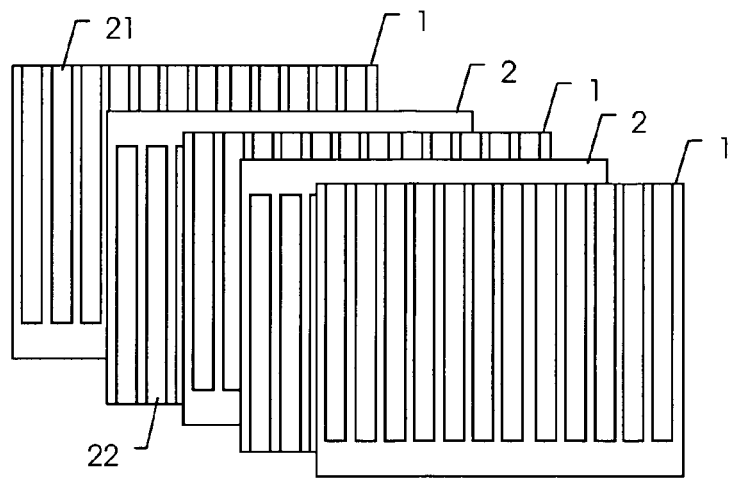
FIG. 3 shows the construction of an interposer according to the invention.

FIG. 3 shows the formation of an interposer according to the invention. Foils of sheets of a first type 1 and of a second type 2 are stacked in alternating order. For example, as shown in FIG. 3, the first type 1 and of the second type 2 are shown to be rotated 180 degrees of each other with respect to the position of the pads 26a-d (see FIG. 1) or the circuit board layers 27, 28 (see FIG. 2). Type 1 foils carry the metal structures 21, which extend to the top surface of the interposer and type 2 foils carry the metal structures 22, which extend towards the bottom surface of the interposer. By alternating the type 1 and type 2 foils, each including the metal structures 21, 22, a two dimensional structure may be formed. See FIGS. 5 and 7, as described in more detail below, for examples of two dimensional structures that may be formed. The width of a metal structure, for example metal structures 21, 22, plus the distance to the next metal structure on a foil is at least smaller than the pitch of the pins of the microchip to be attached. Referring to FIG. 6 described in more detail below, the width of the metal structure may be the width of the white line indicated on FIG. 6. The distance to the next metal structure may be the width of the black or empty space between two white lines as indicated on FIG. 6. Preferably, the width of the metal structure plus the distance to the next metal structure on a foil is smaller than half the pitch of the microchip pins. Positioning of the interposer with respect to circuit board and microchip is hence not required since the inner metal structures cannot cause a shortcut in whatever arbitrary position. As an example, the pitch of the microchip pins can be 1 mm. The width of the metal structure plus the distance to the next metal structure on a foil of the metal structures is then chosen to 0.4 mm.

The foils 1 and 2 can be made of polypropylene or polystyrene, for instance and good candidates for the material of the metal structures 21 and 22 are copper, silver, aluminum, or gold.

The foils 1 and 2 are piled on a stack and then melted or glued together in a thermo-compression step. From the bulk pile thus formed, thin slices can be cut or sawed that build the interposer.

The capacity that can be reached on the interposer by connecting these metal structures depends on the thickness of the foils and the surface area over which metal structures are connect and thus activated, but can be in the range of up to 20 nF.

Figure 4:
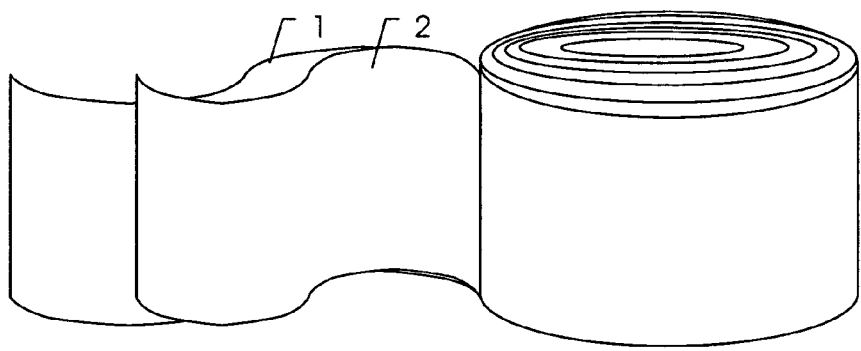
FIG. 4 shows an alternative construction of an interposer according to the invention.

In FIG. 4, as an alternative, long widths of foils 1 and 2 are curled to a reel, and bonded together to form a bulk cylinder, from which thin slices can than be sawed or cut to build the interposer.

Figure 5:
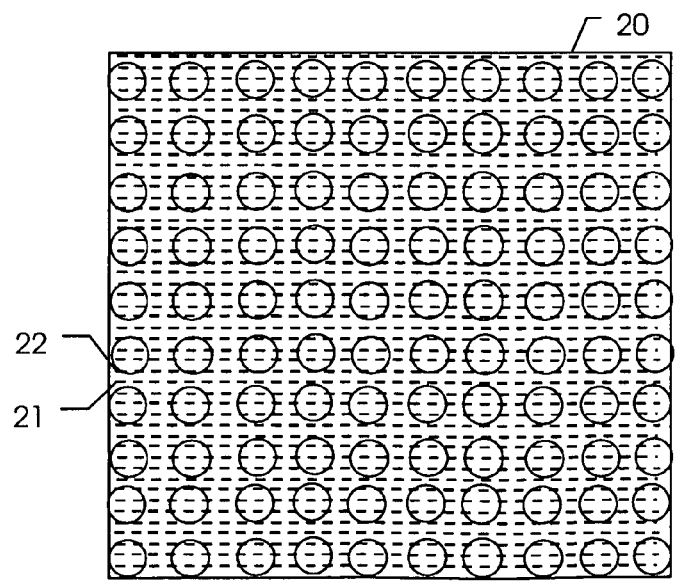
FIG. 5 shows a cross-section of an interposer compared to the pitch of a microchip.
Figure 6:
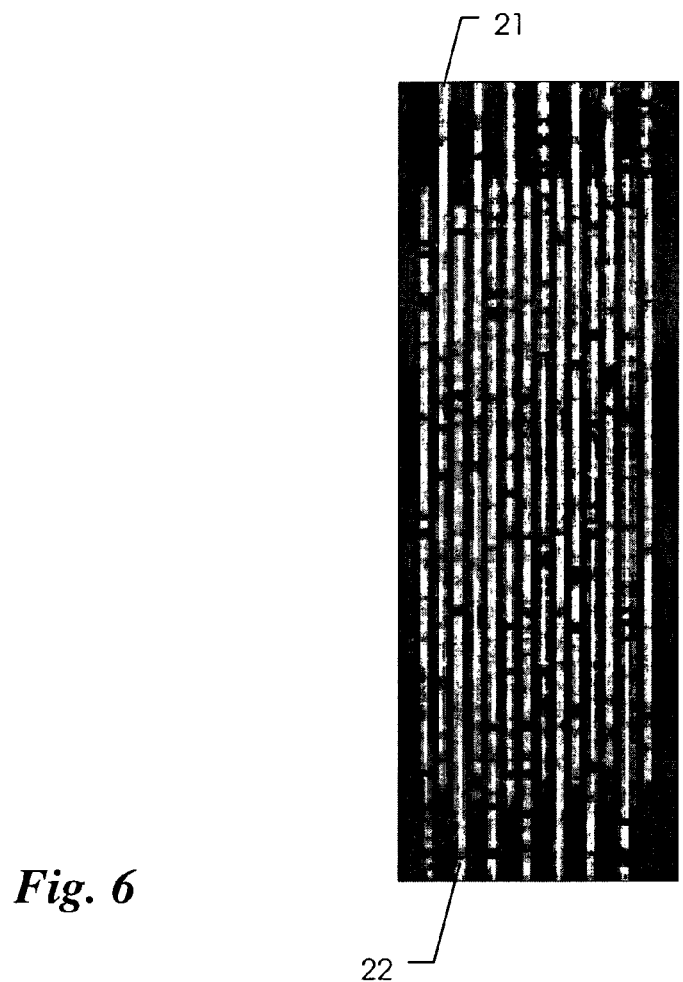
FIG. 6 shows a polished cut image of an interposer according to the invention.

FIG. 5 shows a horizontal cross-section through interposer 20. The grid of circles indicates the pitch of a BGA microchip and the horizontal rows of small stripes represent the vertical metal structures 21 and 22.

FIG. 6 shows a microscope photograph of a polished cut of the interposer 20, which shows the two types of metal structures 21 and 22.

Rather than bonding layers of foils together, the interposer can alternatively be formed by growing ceramic layers between which the two sets of metal structures 21 and 22 are deposited and etched in alternating order. This is similar to the manufacturing of known ceramic capacitors, but that the metal layers between the ceramic layers are sub-structured according to the principle invention.

Figure 7:
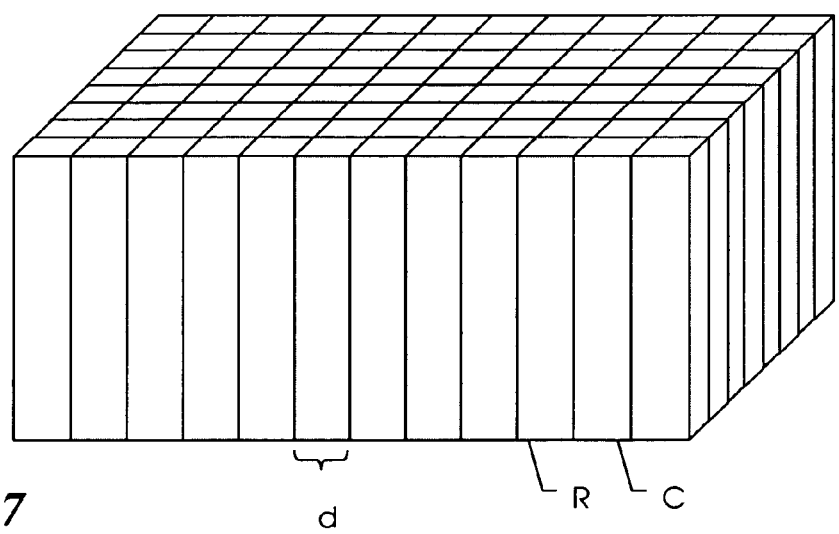
FIG. 7 shows an implementation with additional through connections.

Another embodiment of the invention is shown in FIG. 7. The interposer is here constructed in a chessboard topology from capacitive elements C of the type shown in FIG. 6 including the vertical metal structures as described above and from conductive elements R, which serve as through-connections. The width d of the elements equals the pitch of the BGA pins of the microchip to be attached. Proper design of top and bottom metal layers (not shown) allow the implementation of any circuit that might be required in a particular application. Preferably, conductive elements R are provided only each second row in the chessboard topology.

Having described specific embodiments of the present invention in full detail, it should be clear to those skilled in the art, that various modifications and changes can be made without departing from the concepts of the invention.

The invention claimed is:

1. An interposer for decoupling a microchip on a circuit board, said interposer comprising:
   structured metal layers, on a top and a bottom surfaces of the interposer, configured to attach the microchip and the circuit board to the interposer;
   two sets of mutually isolated metal structures, inside the interposer, extending substantially perpendicular to the top and the bottom surfaces of the interposer; such that,
      a first set extends closer towards the top surface than a second set, and said second set extends closer towards the bottom surface than said first set, and
      each of said two sets of mutually isolated metal structures are arranged in a regular, two dimensional array pattern, the first set alternating with the second set in at least one horizontal direction, such that adjacent metal structures have a spacing which is smaller than a pitch of two connections of the microchip, said spacing including a width of a first metal structure plus a distance between the first metal structure and an adjacent second metal structure, the first metal structure and the adjacent second metal structure being metal strips having lengths in which a portion of a length associated with the first metal structure overlaps a portion of a length associated with the adjacent second metal structure, wherein
   said structured metal layers and said mutually isolated metal structures are structured to form capacitors, each capacitor having a portion of a top metal layer electrically connected to some of the metal structures of the first set and a portion of a bottom metal layer electrically connected to adjacent metal structures of the second set, and
   each capacitor having a variable capacitance based on a position of the portion of the top metal layer relative to a position of the portion of the bottom metal layer.

2. The interposer according to claim 1, further comprising:
   through-connections between said structured top and bottom metal layers, at least one through-connection having a blind via reaching from the structured metal layer on a first surface down to metal structures of a set of the two sets extending towards and connecting to the structured metal layer on a second and opposite surface.

3. The interposer according to claim 1, wherein the spacing between adjacent metal structures is less than half of the pitch of the two connections of the microchip.

4. The interposer according to claim 1, further comprising: vertically joint foils carrying said metal structures.

5. The interposer according to claim 4, wherein said foils carry in alternating order said two sets of metal structures, respectively.

6. The interposer according to claim 1 further comprising: a reel of two foils carrying said two sets of metal structures, respectively.

7. The interposer according to claim 1 further comprising: vertical ceramic layers between which said two sets of metal structures are deposited in alternating order.

8. The interposer according to claim 1, wherein said first set of metal structures connect to the top metal layer and said second set of metal structures connect to the bottom metal layer.

9. The interposer according to claim 1, wherein,
the top metal layer is connectable to said first set of metal structures by a blind via of a first depth and to said second set of metal structures by a blind via of a second depth, and
the bottom metal layer is connectable to said second set of metal structures by a blind via of the first depth and to said first set of metal structures by a blind via of the second depth.

10. A circuit board comprising:
at least one microchip attached on the circuit board; and
an interposer between said circuit board and said microchip, the interposer including structured metal layers, on a top and a bottom surfaces of the interposer, configured to attach the microchip and the circuit board to the interposer, two sets of mutually isolated metal structures inside the interposer extending substantially perpendicular to the top and the bottom surfaces of the interposer, such that,
a first set extends closer towards the top surface than a second set and said second set extends closer towards the bottom surface than said first set, and
each of said two sets of metal structures are arranged in a regular, two dimensional array pattern, the first set alternating with the second set in at least one horizontal direction, such that adjacent metal structures have a spacing which is smaller than a pitch of two connections of the microchip, said spacing including a width of a first metal structure plus a distance between the first metal structure and an adjacent second metal structure, the first metal structure and the adjacent second metal structure being metal strips having lengths in which a portion of a length associated with the first metal structure overlaps a portion of a length associated with the adjacent second metal structure, wherein
said structured metal layers and said mutually isolated metal structures are structured to form capacitors, each capacitor having a portion of a top metal layer electrically connected to some of the metal structures of the first set and a portion of a bottom metal layer electrically connected to adjacent metal structures of the second set, and
each capacitor having a variable capacitance based on a position of the portion of the top metal layer relative to a position of the portion of the bottom metal layer.

* * * * *